(12) United States Patent
Cranford, Jr. et al.

(10) Patent No.: US 7,692,447 B2
(45) Date of Patent: Apr. 6, 2010

(54) DRIVER CIRCUIT

(75) Inventors: Hayden Clavie Cranford, Jr., Cary, NC (US); Christian I. Menolfi, Langnau am Albis (CH); Martin Leo Schmatz, Rueschlikon (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/115,933

(22) Filed: May 6, 2008

(65) Prior Publication Data

US 2008/0284466 A1 Nov. 20, 2008

(30) Foreign Application Priority Data

May 18, 2007 (EP) .................................. 07108440

(51) Int. Cl.
*H03K 17/16* (2006.01)
(52) U.S. Cl. ........................... 326/30; 326/86; 327/108; 365/189.05
(58) Field of Classification Search .................. 326/30; 327/108
See application file for complete search history.

(56) References Cited

U.S. PATENT DOCUMENTS

| | | | | |
|---|---|---|---|---|
| 6,690,191 B2 * | 2/2004 | Wu et al. | ...................... | 326/30 |
| 6,762,620 B2 * | 7/2004 | Jang et al. | ...................... | 326/30 |
| 6,930,506 B2 | 8/2005 | Cranford, Jr. et al. | | |
| 6,930,507 B2 * | 8/2005 | Dreps et al. | ...................... | 326/30 |
| 7,093,041 B2 * | 8/2006 | Gasparik | ...................... | 710/100 |
| 7,312,627 B2 * | 12/2007 | An | ............................... | 326/30 |
| 7,426,145 B2 * | 9/2008 | Lee et al. | ................ | 365/189.05 |
| 2004/0141391 A1 * | 7/2004 | Lee et al. | ...................... | 365/200 |
| 2008/0304334 A1 * | 12/2008 | Lee et al. | ................ | 365/189.05 |

* cited by examiner

*Primary Examiner*—Vibol Tan

(57) ABSTRACT

A driver circuit is provided comprising at least two equal main units (MU) each comprising at least two sub units (SU) coupled to a data output (dout). Each sub unit (SU) is adapted to represent a respective predetermined impedance. Each main unit (MU) is adapted to that, when in a data mode, each sub unit (SU) of the respective main unit (MU) is switchable to either a first or second reference potential depending on a data signal to transmit. Each main unit (MU) is further adapted to that, when in a termination mode, the sub units (SU) of the respective main unit (MU) are switched to either the first or second reference potential such that an output of the respective main unit (MU) is neutral with respect to the driving of the data output (dout) to the first or second reference potential.

2 Claims, 3 Drawing Sheets

Fig. 5

| PDMODE / OPMODE | SUa w: 16/31 | SUb w: 8/31 | SUc w: 4/31 | SUd w: 2/31 | SUe w: 1/31 |
| --- | --- | --- | --- | --- | --- |
| 0 dB | d1 | d1 | d1 | d1 | d1 |
| -3 dB | d1 | d1 | -d2 | d1 | -d2 |
| -6 dB | d1 | -d2 | d1 | d1 | d1 |
| -8 dB | d1 | -d2 | d1 | d1 | -d2 |
| -8 / -11 dB | d1 | -d2 | d1 | -d0 | -d2 |
| TERM | 1 | -1 | -1 | -1 | -1 |

| PDMODE / OPMODE | SUa w: 16/31 | SUb w: 8/31 | SUc w: 4/31 | SUd w: 2/31 | SUe w: 1/31 | HT-3 | FBD-2 |
| --- | --- | --- | --- | --- | --- | --- | --- |
| 0 dB | d1 | d1 | d1 | d1 | d1 | X | X |
| -0.6 dB | d1 | d1 | d1 | d1 | -d2 |  | X |
| -1.2 dB | d1 | d1 | d1 | -d2 | d1 |  | X |
| -1.9 dB | d1 | d1 | d1 | -d2 | -d2 |  | X |
| -2.6 dB | d1 | d1 | -d2 | d1 | d1 | X | X |
| -3.4 dB | d1 | d1 | -d2 | d1 | -d2 |  | X |
| -4.3 dB | d1 | d1 | -d2 | -d2 | d1 |  | X |
| -5.2 dB | d1 | d1 | -d2 | -d2 | -d2 |  | X |
| -6.3 dB | d1 | -d2 | d1 | d1 | d1 | X | X |
| -7.5 dB | d1 | -d2 | d1 | d1 | -d2 | X | X |
| -9 dB | d1 | -d2 | d1 | -d2 | d1 |  | X |
| -10.7 dB | d1 | -d2 | d1 | -d2 | -d2 | X | X |
| -12.9 dB | d1 | -d2 | -d2 | d1 | d1 |  | X |
| -15.8 dB | d1 | -d2 | -d2 | d1 | -d2 |  | X |
| -20.3 dB | d1 | -d2 | -d2 | -d2 | d1 |  |  |
| -29.8 dB | d1 | -d2 | -d2 | -d2 | -d2 |  |  |
| TERM | 1 | -1 | -1 | -1 | -1 |  |  |

Fig. 6

DRIVER CIRCUIT

CROSS-REFERENCE TO RELATED APPLICATIONS

This application claims priority under 35 U.S.C. § 119 to EP Application No. 07/108440 filed May 18, 2007, the entire content of which is specifically incorporated by reference herein.

TECHNICAL FIELD

The present invention relates to a driver circuit for driving a transmission line for transmitting data.

BACKGROUND OF THE INVENTION

U.S. Pat. No. 6,930,506 B2 discloses a terminating resistor driver for high speed data communication. The driver circuit has a plurality of parallel units each comprising two resistors and an upper and a lower switch. The resistors are each connected to a transmission line with one end and connected to the upper or the lower switch, respectively, with the other end. The upper switch is further connected to an upper reference potential and the lower switch is further connected to a lower reference potential. A total impedance of all the resistors equals an impedance of the associated transmission line.

It is a challenge to provide a driver circuit with advantageous voltage margining functionality. It is a further challenge to provide a driver circuit with advantageous termination impedance matching functionality.

SUMMARY OF THE INVENTION

According to a first aspect of the invention, a driver circuit is provided comprising at least two main units each comprising at least two sub units coupled with a data output of the driver circuit that is connectable to a transmission line. Each sub unit is adapted to represent a respective predetermined impedance. Each main unit comprises an individual operation mode signal input and is adapted to select either a data mode or a termination mode of the respective main unit depending on an operation mode signal provided at the operation mode signal input. Each main unit is further adapted to that, when in data mode, each sub unit of the respective main unit is switchable to either a first reference potential or to a second reference potential depending on a data signal to transmit over the transmission line. Each main unit is further adapted to that, when in termination mode, the sub units of the respective main unit are switched to either the first reference potential or to the second reference potential such that an output of the respective main unit is neutral with respect to the driving of the data output to the first reference potential or to the second reference potential.

It is advantageous that the output impedance does not depend on the operation mode of the main units and does not depend on the sub units being switched to either the first or the second reference potential. The drive strength depends on the ratio of the number of main units operated in data mode to the number of main units operated in termination mode. Main units operated in data mode increase the drive strength of the driver circuit and main units operated in termination mode reduce the drive strength of the driver circuit. The advantage is that the drive strength can be adjusted easily by setting individual main units to either data mode or termination mode. By this, voltage margining can be performed easily for testing purposes. Sub units of each main unit set to data mode can be controlled easily to further influence the drive strength depending on the data signal to transmit. A further advantage is that the driver circuit has a simple architecture and is therefore easy to implement and control. The at least two main units may be equal main units.

According to a preferred embodiment, each main unit comprises an enable signal input and is adapted to select either an enabled mode, in which the predetermined impedances of its sub units determine its output impedance, or a disabled mode, in which the respective main unit adopts a high impedance state independent of the predetermined impedances of its sub units, dependent on an enable signal provided at the enable signal input.

Output impedances of all main units are electrically arranged in parallel. An advantage is that the output impedance of the driver circuit can be matched easily to an impedance of the trans-mission line by enabling or disabling individual main units by means of the individual enable signal inputs of the main units. Disabled main units do not substantially influence the output impedance of the driver circuit. A further advantage is that the matching of the output impedance of the driver circuit to the impedance of the transmission line and the driving of the data output can be performed independently. The driver circuit is therefore simple and easy to control.

According to a second aspect of the invention, a driver circuit is provided comprising at least two main units each comprising at least two sub units coupled with a data output of the driver circuit that is connectable to a transmission line. Each sub unit is adapted to represent a respective predetermined impedance and is adapted to be switchable to either a first reference potential or to a second reference potential depending on a data signal to transmit over the transmission line. Each main unit comprises an individual enable signal input and is adapted to select either an enabled mode, in which the predetermined impedances of its sub units determine its output impedance, or a disabled mode, in which the respective main unit adopts a high impedance state independent of the predetermined impedances of its sub units, dependent on an enable signal provided at the enable signal input. The at least two main units may be equal main units.

Output impedances of all main units are electrically arranged in parallel. An advantage is that the output impedance of the driver circuit can be matched easily to an impedance of the transmission line by enabling or disabling individual main units. Disabled main units do not substantially influence the output impedance of the driver circuit. A further advantage is that the matching of the output impedance of the driver circuit to the impedance of the transmission line and the driving of the data output can be performed independently. The output impedance does not depend on the sub units being switched to either the first or the second reference potential. Sub units of each main unit can be controlled easily to influence the drive strength depending on the data signal to transmit. The driver circuit is therefore simple and easy to control.

According to a preferred embodiment according to the first and the second aspect of the invention, the respective individually predetermined impedances of all sub units of each main unit are weighted according to a predetermined coding.

The advantage is that the drive strength of each main unit can be adjusted easily depending on which sub units are switched to the first reference potential and which sub units are switched to the second reference potential. The weighting is simple to implement.

In this respect, it is advantageous, if the respective individually predetermined impedances of all sub units of each main unit are weighted according to a binary coding. The advantage is that there are up to two raised to the power of the number of sub units minus one in each main unit of different levels for the drive strength. The drive strength can thus be adjusted precisely. A further advantage is that the drive strength is easy to control.

According to a further preferred embodiment, each main unit comprises an individual data signal input for each sub unit and is adapted to control the switching of the respective sub unit to the first reference potential and to the second reference potential dependent on an individual data signal provided at the respective individual data signal input. The respective data signal inputs of corresponding sub units of all main units are electrically connected.

The advantage is that corresponding sub units of all main units can be controlled via a single data signal. Because of this, the driver circuit is simple to implement and easy to control. Corresponding sub units are particularly corresponding with respect to their weighting.

In this respect, it is advantageous, if the driver circuit comprises a pre-distortion control unit with a data input for inputting the data signal to transmit and a respective data signal output for each data signal input of the corresponding sub units. The pre-distortion control unit comprises one time delay element or two or more than two time delay elements arranged logically in series adapted to delay the data signal provided at the data input for one, two or more than two predetermined time units, respectively. The pre-distortion control unit further comprises a sub unit mapping logic adapted to select for each data signal output one of the delayed data signals or the undelayed data signal dependent on a predetermined pre-distortion mode.

The advantage is that channel equalization can be performed easily by pre-distorting the data signal to transmit. The pre-distortion can also be called de-emphasis and particularly comprises high-pass filtering of the data signal. Pre-distortion enables the compensation of frequency-dependent attenuation of the transmission line and enhances signal quality at the receiver. The driver circuit with its main units and sub units in combination with the pre-distortion control unit implements a finite impulse response filter. The predetermined pre-distortion mode determines the filter characteristic and signal attenuation by configuring the sub unit mapping logic accordingly. The pre-distortion functionality is simple to implement and easy to control. The time delay elements are preferably arranged as a shift-register.

According to a further preferred embodiment, each sub unit comprises a first and a second switching element, two resistors determining the respective predetermined impedance of the respective sub unit and a sub unit control unit controlling the first and the second switching element dependent on the enable signal and/or the operation mode signal and/or the data signal to transmit. The data output is coupled with the first reference potential over one of the two resistors and the first switching element and the data output is coupled with the second reference potential over the other of the two resistors and the second switching element.

The advantage is that the driver circuit is simple to implement. The disabled mode of the respective main unit can be provided easily by switching both switching elements off in all sub units of the respective main unit. In the enabled mode of the respective main unit, one of the switching elements in each sub unit of the respective main unit is switched on, the other switching element is switched off.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE PREFERRED EMBODIMENTS

Line drivers are an important building block in data input/output transmission systems. They encode data symbols into a traveling wave signal to be transmitted over a transmission channel, e.g. a transmission line TL. The vast majority of high-speed transmission systems is limited by a non-ideal transmission channel, in particular with respect to frequency dependent channel loss and channel line impedance discontinuities. In order to allow for a reliable data detection at a receiver, special measures are used to compensate for these adverse effects. These measures comprise channel equalization and termination impedance control. There is further a desire for monitoring of the transmission reliability. For this, the signal strength is gradually reduced in order to find a detection limit and an available margin while maintaining termination impedance and channel equalization constant. This procedure is called "voltage margining".

In the following is described a driver circuit of a line driver with programmable impedance termination and/or programmable channel equalization and/or programmable voltage margining. The driver circuit is based on a modular slice structure and is preferably implemented with CMOS semiconductor technology, preferably with low-power CMOS semiconductor technology.

Figure 1:
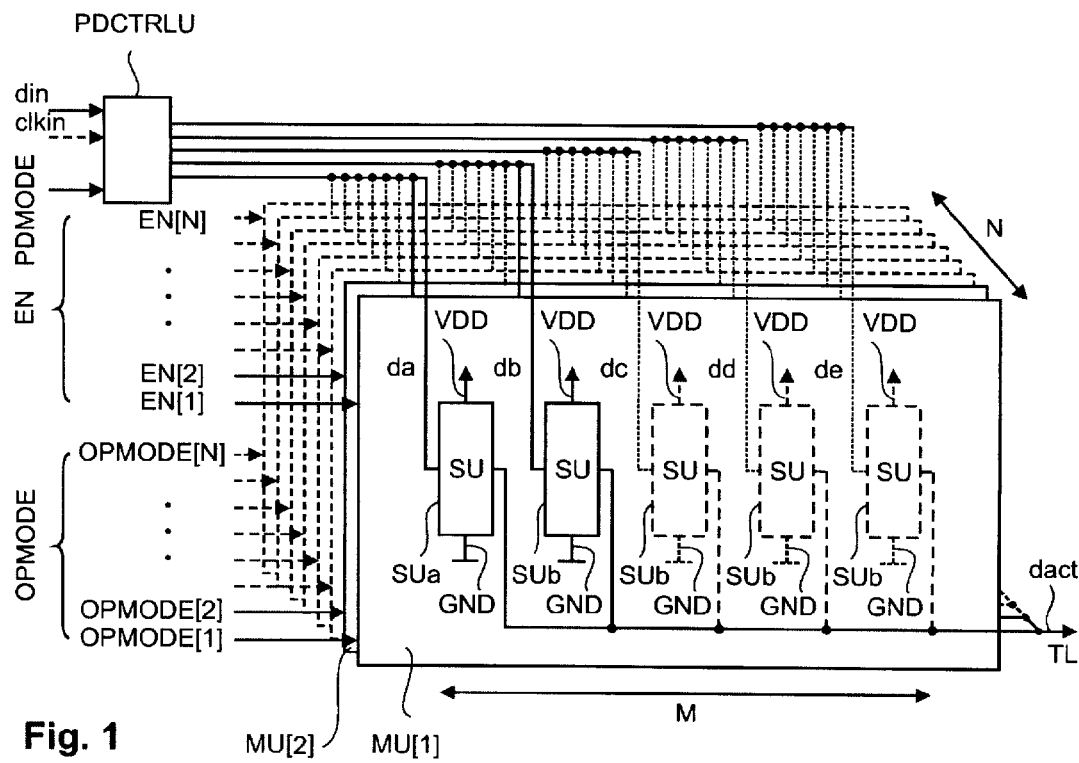
FIG. 1, a block diagram of a driver circuit,
FIG. 2, a block diagram of a main unit with five sub units,
FIG. 3, a block diagram of a pre-distortion control unit,
FIG. 4, a block diagram of a sub unit mapping logic,
FIG. 5, a first table and
FIG. 6, a second table.

FIG. 1 shows a driver circuit for driving the transmission line TL. The transmission line TL is connectable to a data output dout of the driver circuit. The driver circuit comprises a number N of main units MU. The number N of main units MU is equal to or greater than two. All main units MU are preferably equal. Each main unit MU comprises a number M of sub units SU. The number M of sub units SU is equal to or greater than two. The resulting structure is a N times M array of sub units SU. In the examples shown in the figures, the number M of sub units SU equals five, so each main unit MU comprises a first sub unit SUa, a second sub unit SUb, a third sub unit SUc, a fourth sub unit SUd and a fifth sub unit SUe.

Each sub unit SU is coupled with a first reference potential and with a second reference potential. The first reference potential is preferably a supply voltage VDD and the second reference potential is preferably a ground potential GND. The first reference potential and/or the second reference potential can also be chosen differently depending on the application. For example, the first reference potential corresponds to a logic high voltage level and the second reference potential corresponds to a logic low voltage level.

Each sub unit SU comprises an individual data signal input. Via the respective data signal input the first sub unit SUa is adapted to receive a first data signal da, the second sub unit SUb is adapted to receive a second data signal db, the third sub unit SUc is adapted to receive a third data signal dc, the fourth sub unit SUd is adapted to receive a fourth data signal dd and the fifth sub unit SUe is adapted to receive a fifth data signal de. The driver circuit comprises a pre-distortion control unit PDCTRLU adapted to provide the first, the second, the third, the fourth and the fifth data signal da, db, dc, dd, de dependent on a data signal provided at its data input din. The data signal provided at the data input din represents the data symbols to transmit over the transmission line TL. Preferably, the individual data signal inputs of all corresponding sub units SU are electrically connected and thus receive the same data signal. Corresponding sub units are, for example, the first sub units SUa of all main units MU. Thus, all first sub units SUa are adapted to receive the same first data signal da. Accordingly, the second sub units SUb of all main units MU are corresponding sub units SU. Thus, all second sub units SUb are adapted to receive the same second data signal db. The same pattern can be applied to the third, the fourth and the fifth sub unit SUc, SUd, SUe. The sub units SU are adapted to generate an output signal at the data output dout by pulling its voltage level up to the first reference potential or down to the second reference potential dependent on the respective data signal.

Each main unit MU of the driver circuit comprises an individual enable signal input and/or an individual operation mode signal input. Preferably, all main units MU of the driver circuit respectively comprise the individual enable signal input and the individual operation mode signal input. Each main unit comprising the enable signal input is adapted to select an enabled mode or a disabled mode dependent on an individual enable signal EN provided at the respective enable signal input. Each main unit comprising the operation mode signal input is adapted to select a data mode or a termination mode TERM dependent on an individual operation mode signal OPMODE provided at the respective operation mode signal input.

The main units MU are adapted to generate the output signal at the data output dout by pulling the voltage level up or down dependent on the data signal provided at the data input din when in data mode. In other words: The main units MU in data mode actively pull up or down the voltage level at the data output dout. The main units MU are adapted to generate a neutral output with respect to pulling up or down the voltage level when in termination mode TERM. In other words: The main units MU in termination mode TERM do not actively pull up or down the voltage level at the data output dout. By this, main units MU in data mode increase the drive strength whereas main units MU in termination mode TERM reduce the drive strength of the driver circuit. For example, if there are ten enabled main units MU and five of these are in data mode and the other five are in termination mode TERM, the resulting drive strength amounts to $5/10=0.5$. If only one main unit MU is in data mode and nine main units MU are in termination mode TERM, the resulting drive strength amounts to $1/10=0.1$. The resulting drive strength can thus be scaled easily and linearly by selecting the data mode on an appropriate number of main units MU. The drive strength can be made programmable easily. The scaling of the drive strength can be used advantageously for voltage margining.

All sub units SU are coupled with the data output dout and are thus arranged electrically in parallel. Each sub unit SU is adapted to represent a respective predetermined impedance. The combined impedances of all sub units SU of each main unit MU in the enabled mode represent the termination impedance of the driver circuit. Main units MU in the disabled mode do not substantially contribute to the termination impedance of the driver circuit. By this, the termination impedance depends on the number of main units MU in the enabled mode. The termination impedance is adjustable by enabling or disabling main units MU and can thus be matched to an impedance of the transmission line TL. The termination impedance can be made programmable easily.

Figure 2:
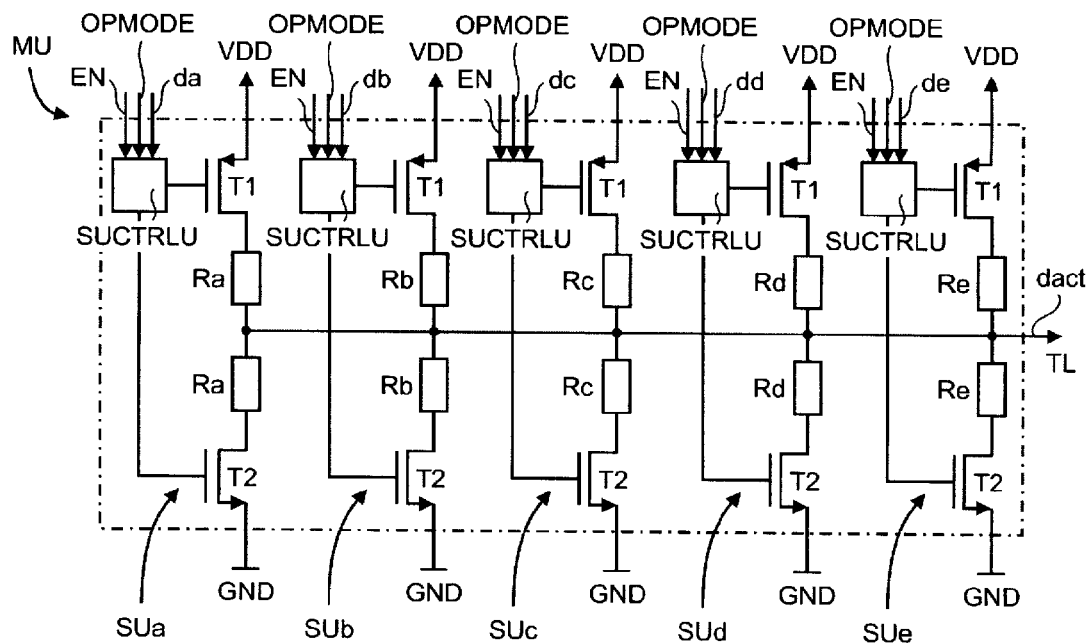

FIG. 2 shows a detailed block diagram of one of the main units MU and its sub units SU. Each sub unit SU comprises a sub unit control unit SUCTRLU and a first and a second switching element. For example, the first switching element is implemented as a first transistor T1, e.g. a PMOS-type transistor, and the second switching element is implemented as a second transistor T2, e.g. a NMOS-type transistor. The first transistor T1 is coupled with the supply voltage VDD and the second transistor T2 is coupled with the ground potential GND. The sub unit control unit SUCTRLU is adapted to control the switching of the first and the second transistor T1, T2 dependent on the respective data signal and the enable signal EN and/or the operation mode signal OPMODE.

Each sub unit SU further comprises two resistors that determine its respective predetermined impedance. For example, the first sub unit SUa comprises two resistors with a first resistance Ra, the second sub unit SUb comprises two resistors with a second resistance Rb, the third sub unit SUc comprises two resistors with a third resistance Rc, the fourth sub unit SUd comprises two resistors with a fourth resistance Rd and the fifth sub unit SUe comprises two resistors with a fifth resistance Re. The first transistor T1 is respectively coupled with the data output dout over one of the two resistors and the second transistor T2 is respectively coupled with the data output dout over the other of the two resistors. The resistance of the respective two resistors is such that the impedance of each sub unit SU, and thus also of each enabled main unit MU, is independent of the respective sub unit SU being switched to pull the voltage level up or down. The voltage level is pulled up by the respective sub unit SU if its first transistor T1 is switched on and its second transistor T2 is switched off. Accordingly, the voltage level is pulled down by the respective sub unit SU if its first transistor T1 is switched off and its second transistor T2 is switched on. In the disabled mode of the respective main unit MU both its first and second transistor T1, T2 are switched off in all sub units SU. By this, the main unit MU adopts a high-impedance state und does therefore not substantially influence the termination impedance of the driver circuit. In the enabled mode of the respective main unit MU one its first and second transistors T1, T2 is switched on and the other is switched off in all its sub units SU. By this, the main unit MU adopts a fixed impedance determined by the combined impedances of all of its sub units SU.

Preferably, the respective individual predetermined impedances of all sub units SU are weighted according to a predetermined coding. For example, the predetermined coding is a binary coding. The weighting of the impedances of all sub units SU is chosen such that each sub unit SU represents a respective predetermined drive strength with which the voltage level of the data output dout is pulled up or down. This resulting drive strength of each sub unit SU is represented by a weight w. The weight w is proportional to the inverse of the respective impedance. If there are, for example, five sub units SU, the first resistance Ra is chosen to represent a weight w of 16/31 with respect to drive strength, the second resistance Rb is chosen to represent the weight w of 8/31, the third resistance Rc is chosen to represent the weight w of 4/31, the fourth resistance Rd is chosen to represent the weight w of 2/31 and the fifth resistance Re is chosen to represent the weight w of 1/31 with respect to drive strength. For example, the first resistance Ra equals the parallel combination of the second, the third, the fourth and the fifth resistance Rb, Rc, Rd, Re, i.e. Ra=Rb∥Rc∥Rd∥Re. The combined impedance of all five sub units SU of the respective main unit MU amounts to 1/(1/Ra+1/Rb+1/Rc+1/Rd+1/Re). As a result, the first resistance Ra corresponds to 31/16 of the combined impedance of all five sub units SU and the fifth resistance Re corresponds to 31 times the combined impedance of all five sub units SU. The termination mode TERM of the respective main unit MU can thus achieved easily by selecting its first sub unit SUa to pull up and its other sub units SU to pull down or vice versa. By this, the first sub unit SUa compensates the other sub units SU with respect to pulling up or down, respectively. Other codings than the binary coding can be implemented. For example, it may be advantageous to choose a coding with the weight w of 10/20 with respect to drive strength for the first sub unit SUa, the weight w of 4/20 for the second sub unit SUb, the weight w of 3/20 for the third sub unit SUc, the weight w of 2/20 for the fourth sub unit SUd and the weight of 1/20 for the fifth sub unit SUe. This is particularly advantageous for an implementation according to the hyper transport 3 standard.

Figure 3:
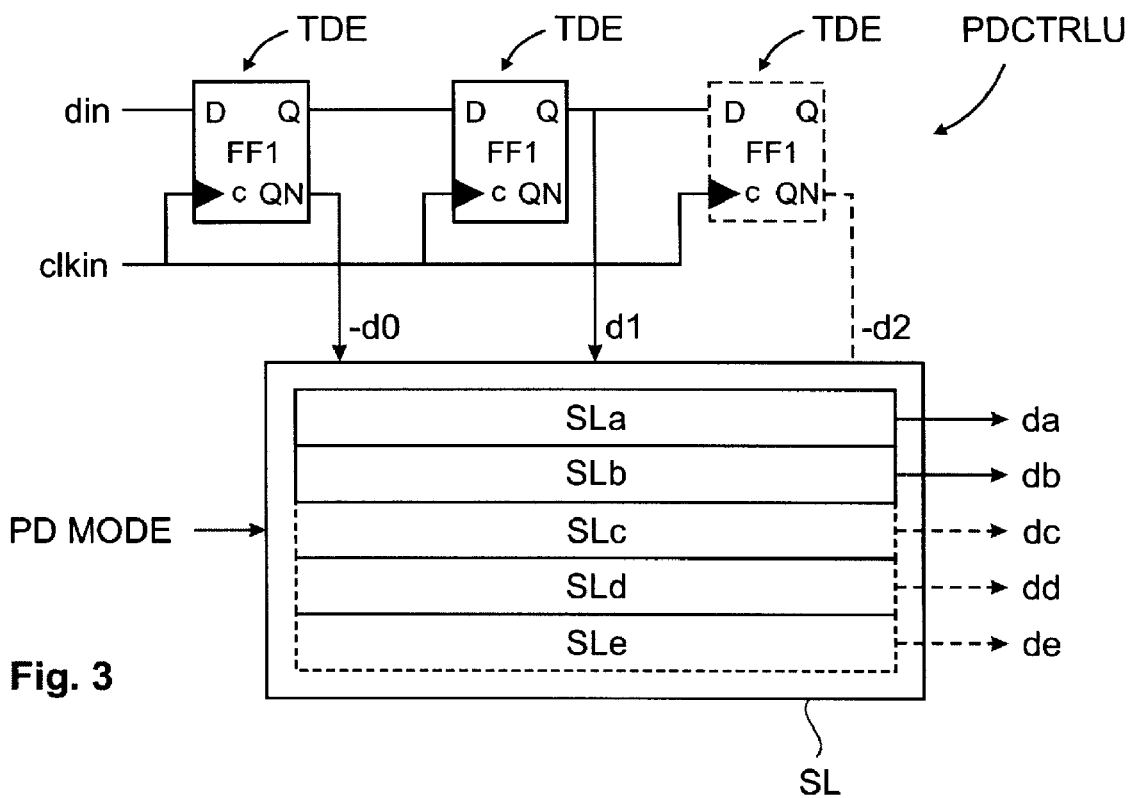

FIG. 3 shows a block diagram of the pre-distortion control unit PDCTRLU. The pre-distortion control unit PDCTRLU controls the sub units SU of the enabled main units MU dependent on the data signal provided at the data input din and a predetermined pre-distortion mode PDMODE. Pre-distortion, which can also be called de-emphasis, is utilized for effecting channel equalization. The pre-distortion control unit PDCTRLU in combination with the sub units SU represents a finite impulse response filter, or short: FIR-filter. For this, the pre-distortion control unit PDCTRLU comprises at least one time delay element TDE and preferably comprises two or three time delay elements TDE arranged in series. More than three time delay elements TDE can also be provided if. The time delay elements TDE are preferably arranged as a shift register. Each time delay element TDE is, for example, represented by a flip-flop. In the example shown in FIG. 3 there are a first, a second and a third flip-flop FF1, FF2, FF3. A data input D of the first flip-flop FF1 is coupled with the data input din of the driver circuit. A non-inverted data output Q of the first flip-flop FF1 is coupled with a data input D of the second flip-flop FF2 and a non-inverted data output Q of the second flip-flop FF2 is coupled with a data input D of the third flip-flop FF3. A clock input C of each of the flip-flops is coupled with a clock input clkin of the driver circuit. At the clock input clkin a data clock of the data signal provided at the data input din is provided. In the example shown in FIG. 3 an inverted data output QN of the first and the third flip-flop FF1, FF3 and the non-inverted data output Q of the second flip-flop FF2 are coupled with a sub unit mapping logic SL of the pre-distortion control unit PDCTRLU. By this, an inverted pre-cursor data signal d0, a main-cursor data signal d1 and an inverted post-cursor data signal −d2 are fed to the sub unit mapping logic SL. These data signals represent time delayed versions of the data signal provided at the data input din with different delays.

Figure 4:
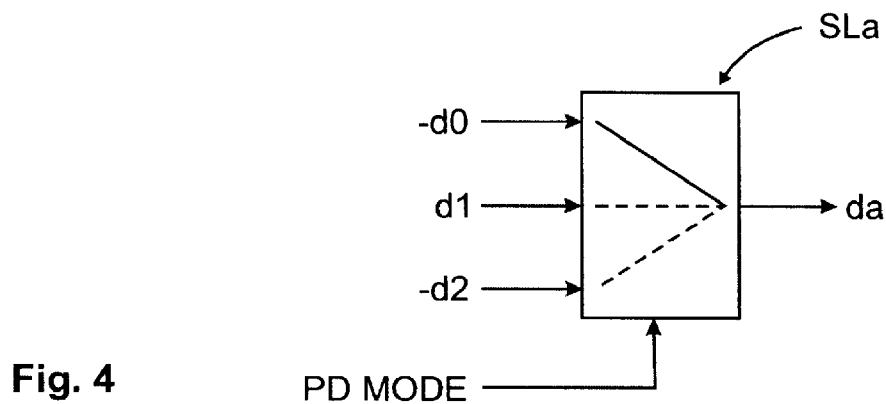

The sub unit mapping logic SL is adapted to map the inverted pre-cursor data signal −d0, the main-cursor data signal d1 and the inverted post-cursor data signal −d2 to the appropriate output for providing the first, second, third, fourth and fifth data signal da, db, dc, dd, de dependent on the predetermined pre-distortion mode PDMODE. A simple way to implement this mapping is to provide a sub unit mapping logic SLa for the first sub units SUa, a sub unit mapping logic SLb for the second sub units SUb, a sub unit mapping logic SLc for the third sub units SUc, a sub unit mapping logic SLd for the fourth sub units SUd and a sub unit mapping logic SLe for the fifth sub units SUe. For example, each of these sub unit mapping logics SL can be implemented as a lookup table or a three-to-one multiplexer as shown for the sub unit mapping logic SLa for the first sub units SUa in FIG. 4. Dependent on the predetermined pre-distortion mode PDMODE the first data signal da is set to represent the inverted pre-cursor data signal −d0, the main-cursor data signal d1 or the inverted post-cursor data signal d2. A simpler sub unit mapping logic SL may be possible or a more complex sub unit mapping logic SL may be necessary depending on the pre-distortion requirements. For example, when providing a two-tap FIR-filter instead of a three-tap FIR-filter as described above for pre-distortion a two-to-one multiplexer or a simple lookup table may be sufficient as implementation of the sub unit mapping logic SL.

FIG. 5 and FIG. 6 each show a table with different predetermined pre-distortion modes PDMODE which are named in the first column by their resulting attenuation of the generated output signal with respect to the level that would be achieved without application of pre-distortion. The last line of each table represents the configuration of the sub units SU for the termination mode TERM of the respective main unit MU where a "1" means that the corresponding sub unit SU is configured to pull up and a "−1" means that the corresponding sub unit SU is configured to pull down. Both tables assume a binary coded weighting of the sub units SU of each main unit MU. Both tables show which of the inverted pre-cursor data signal −d0, the main-cursor data signal d1 or the inverted post-cursor data signal −d2 is represented by the first, second, third, fourth and fifth data signal da, db, dc, dd, de and thus by which of the inverted pre-cursor data signal −d0, the main-cursor data signal d1 or the inverted post-cursor data signal −d2 the first, second, third, fourth and fifth sub unit SUa, SUb, SUc, SUd, SUe is controlled in each of the predetermined pre-distortion modes PDMODE. FIG. 6 has two additional columns showing by a mark in the respective line which of the predetermined pre-distortion modes PDMODE can advantageously be used for implementing the line driver according to the hyper transport 3 standard, or short: HT-3, and according to FBD-2 for data transfer to and from data memories, respectively.

Preferably, at least sixteen main units MU are provided, i.e. the number N of main units MU is equal to or greater than 16. Even more preferably, the number N of main units MU is in the range of 20 to 32. However, the number N of main units MU may also be chosen to be less than 16 or greater than 32 depending on the application. Preferably, each main unit MU has five sub units SU, i.e. the number M of sub units SU in each main unit MU equals five. However, the number M of sub units SU may also be chosen to be less than five or greater than five depending on the application.

We claim:

1. Driver circuit comprising at least two main units (MU) each comprising at least two sub units (SU) coupled with a data output (dout) of the driver circuit that is connectable to a transmission line (TL), wherein:

each sub unit (SU) is adapted to represent a respective predetermined impedance and is adapted to be switchable to either a first reference potential or to a second reference potential depending on a data signal to transmit over the transmission line (TL);

each main unit (MU) comprises an individual enable signal input and is adapted to select either an enabled mode, in which the predetermined impedances of its sub units (SU) determine its output impedance, or a disabled mode, in which the respective main unit (MU) adopts a high impedance state independent of the predetermined impedances of its sub units (SU), dependent on an enable signal (EN) provided at the enable signal input;

each main unit (MU) further comprises an individual data signal input for each sub unit (SU) and is adapted to control the switching of the respective sub unit (SU) to the first reference potential and to the second reference potential dependent on an individual data signal provided at the respective individual data signal input; and the respective data signal inputs of corresponding sub units (SU) of all main units (MU) are electrically connected;

further comprising:

a pre-distortion control unit (PDCTRLU) with a data input (din) for inputting the data signal to transmit and a respective data signal output for each data signal input of the corresponding sub units (SU), one time delay element (TDE) or two or more than two time delay elements (TDE) arranged logically in series adapted to delay the data signal provided at the data input (din) for one, two or more than two predetermined time units, respectively, and a sub unit mapping logic (SL) adapted to select for each data signal output one of the delayed data signals or the undelayed data signal dependent on a predetermined pre-distortion mode (PDMODE).

2. Driver circuit comprising at least two main units (MU) each comprising at least two sub units (SU) coupled with a data output (dout) of the driver circuit that is connectable to a transmission line (TL), wherein:

each sub unit (SU) is adapted to represent a respective predetermined impedance;

each main unit (MU) comprises an individual operation mode signal input and is adapted to select either a data mode or a termination mode (TERM) of the respective main unit (MU) depending on an operation mode signal (OPMODE) provided at the operation mode signal input and each main unit (MU) is further adapted to that:

when in data mode, each sub unit (SU) of the respective main unit (MU) is switchable to either a first reference potential or to a second reference potential depending on a data signal to transmit over the transmission line (TL); and when in termination mode (TERM), the sub units (SU) of the respective main unit (MU) are switched to either the first reference potential or to the second reference potential such that an output of the respective main unit (MU) is neutral with respect to the driving of the data output (dout) to the first reference potential or to the second reference potential;

each main unit (MU) further comprises an individual data signal input for each sub unit (SU) and is adapted to control the switching of the respective sub unit (SU) to the first reference potential and to the second reference potential dependent on an individual data signal provided at the respective individual data signal input; and the respective data signal inputs of corresponding sub units (SU) of all main units (MU) are electrically connected;

further comprising:

a pre-distortion control unit (PDCTRLU) with a data input (din) for inputting the data signal to transmit and a respective data signal output for each data signal input of the corresponding sub units (SU), one time delay element (TDE) or two or more than two time delay elements (TDE) arranged logically in series adapted to delay the data signal provided at the data input (din) for one, two or more than two predetermined time units, respectively, and a sub unit mapping logic (SL) adapted to select for each data signal output one of the delayed data signals or the undelayed data signal dependent on a predetermined pre-distortion mode (PDMODE).

\* \* \* \* \*